US012175102B2

(12) United States Patent
Murphy et al.

(10) Patent No.: US 12,175,102 B2
(45) Date of Patent: *Dec. 24, 2024

(54) DYNAMIC RANDOM-ACCESS MEMORY (DRAM) PHASE TRAINING UPDATE

(71) Applicant: Advanced Micro Devices, Inc., Santa Clara, CA (US)

(72) Inventors: Scott P. Murphy, Portola Valley, CA (US); Huuhau M. Do, Santa Clara, CA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/378,893

(22) Filed: Oct. 11, 2023

(65) Prior Publication Data

US 2024/0036748 A1    Feb. 1, 2024

Related U.S. Application Data

(63) Continuation of application No. 17/560,421, filed on Dec. 23, 2021, now Pat. No. 11,789,620.

(51) Int. Cl.
*G06F 3/00* (2006.01)
*G06F 3/06* (2006.01)

(52) U.S. Cl.
CPC .......... *G06F 3/0629* (2013.01); *G06F 3/0604* (2013.01); *G06F 3/0673* (2013.01)

(58) Field of Classification Search
None
See application file for complete search history.

(56) References Cited

U.S. PATENT DOCUMENTS

2007/0002939 A1\* 1/2007 Daugherty ................ H04L 1/24
375/219
2015/0378956 A1   12/2015 Dearth et al.

\* cited by examiner

*Primary Examiner* — Midys Rojas
(74) *Attorney, Agent, or Firm* — Polansky & Associates, P.L.L.C.; Paul J. Polansky; Nathan H. Calvert

(57) ABSTRACT

A phase training update circuit operates to perform a phase training update on individual bit lanes. The phase training update circuit adjusts a bit lane transmit phase offset forward a designated number of phase steps, transmits a training pattern, and determines a first number of errors in the transmission. It also adjusts the bit lane transmit phase offset backward the designated number of phase steps, transmits the training pattern, and determines a second number of errors in the transmission. Responsive to a difference between the first number of errors and the second number of errors, the phase training update circuits adjusts a center phase position for the bit lane transmit phase offset of the selected bit lane.

20 Claims, 7 Drawing Sheets

DYNAMIC RANDOM-ACCESS MEMORY (DRAM) PHASE TRAINING UPDATE

BACKGROUND

A data processing system includes a data processor such as a central processing unit (CPU) or a graphics processing unit (GPU) that executes instructions and manipulates data. The instructions and data are ultimately stored in a main memory system, which is typically isolated from the data processor. The data processor interacts with the memory system through a memory interface. The functioning of the memory interface is predominantly under the control of the data processor, and is typically performed by a memory controller integrated on the same silicon chip as the data processor.

The predominant type of main memory used in data processing systems today is dynamic random-access memory (DRAM) conforming to industry standard electrical and protocol specifications set forth by the Joint Electron Devices Engineering Councils (JEDEC), known as double data rate (DDR). There are many versions of the DDR standard, including graphics DDR (GDDR) versions that optimize the memory interface for the unique requirements of GPUs. Because of the high amount of main memory bandwidth used by GPUs, GDDR memory systems continue to push the envelope of speed and throughput. For example, a GDDR6 memory interface may operate at a clock speed of 16 gigaHertz (GHz), and because GDDR6 uses a 16-bit bus, the GDDR6 memory interface can achieve a data bandwidth of up to 64 giga-bytes per second (GB/s)

These high speeds necessitate that careful tuning of the timing of each data pin is individually adjusted relative to read and write clocks so that the memory device (for write cycles) and the data processor (for read cycles) are able to capture the data reliably. These timings are adjusted by the data processor using a process called training. Training is typically performed by the memory controller under control of firmware executing on the data processor. When the data processing is initialized, training can take up to several seconds. This amount of delay for startup training and as well as for periodic retraining during operation are noticeable and affect overall user experience.

In some memory systems, such as GDDR6, transmission is susceptible to changes in temperature and voltage, and to clock drift. These changes can result in the data eye that was previously trained shifting with respect to the clock, reducing the timing margins needed for high speed operation.

Figure 1A:
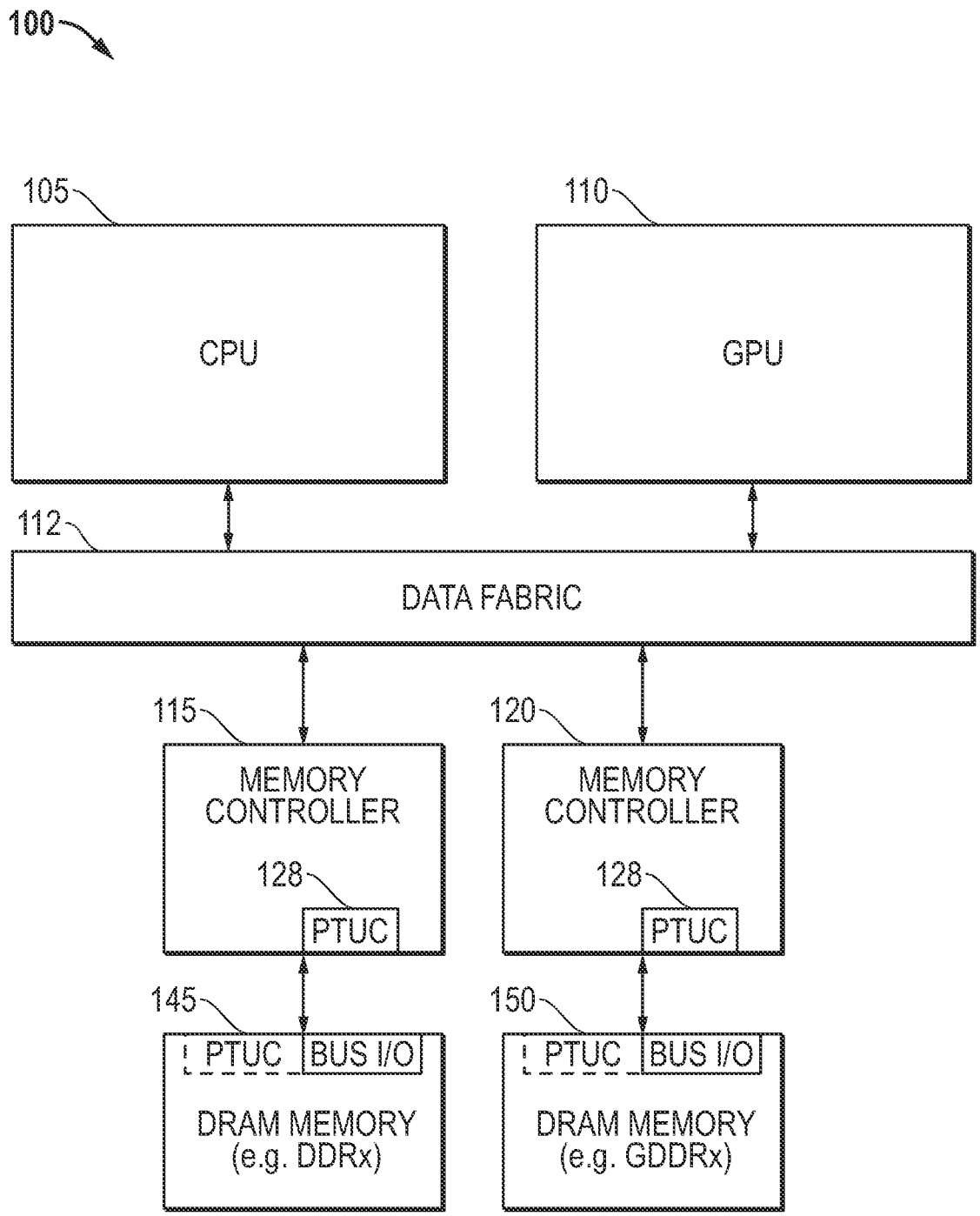
FIG. 1A illustrates in block diagram form a portion of a data processing system according to some implementations.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate implementations using suitable forms of indirect electrical connection as well.

DETAILED DESCRIPTION OF ILLUSTRATIVE IMPLEMENTATIONS

A memory controller includes a built-in self-test circuit and a phase training update circuit. The built-in self-test circuit is for performing initial phase training of a data bus having a predetermined number of bit lanes coupled to a memory. The phase training update circuit is for performing a phase training update on selected individual ones of the bit lanes. The phase training update includes adjusting a bit lane transmit phase offset forward a designated number of phase steps, transmitting a training pattern, and determining a first number of errors in the transmission. It also includes adjusting the bit lane transmit phase offset backward the designated number of phase steps, transmitting the training pattern, and determining a second number of errors in the transmission. Responsive to a difference between the first number of errors and the second number of errors, the phase training update includes adjusting a center phase position for the bit lane transmit phase offset of the selected bit lane.

A method performs training of a memory channel. The method includes performing an initial phase training of a predetermined number of bit lanes of a data bus coupled to a memory. Then the method includes performing phase training updates on selected individual ones of the bit lanes. The phase training updates includes adjusting a bit lane transmit phase offset forward a designated number of phase steps, transmitting a training pattern, and determining a first number of errors in the transmission. They also include adjusting the bit lane transmit phase offset backward the designated number of phase steps, transmitting the training pattern, and determining a second number of errors in the transmission. Responsive to a difference between the first number of errors and the second number of errors, the phase training updates include adjusting a center phase position for the bit lane transmit phase offset of the selected bit lane.

A data processing system includes a data processor, a dynamic random-access memory (DRAM) coupled to the data processor over a data bus having a predetermined number of bit lanes, and a memory controller receiving memory access requests from the data processor and dispatching memory access commands to the DRAM over the data bus. The memory controller includes a built-in self-test circuit for performing initial phase training of the data bus, and a phase training update circuit for performing phase training updates on selected individual ones of the bit lanes. The phase training updates include adjusting a bit lane transmit phase offset forward a designated number of phase steps, transmitting a training pattern, and determining a first number of errors in the transmission. They also include adjusting the bit lane transmit phase offset backward the designated number of phase steps, transmitting the training pattern, and determining a second number of errors in the transmission. Responsive to a difference between the first number of errors and the second number of errors, the phase training updates include adjusting a center phase position for the bit lane transmit phase offset of the selected bit lane.

A memory device includes a memory and a data bus interface circuit coupled to the memory. A phase training update circuit is coupled to the data bus interface circuit for, during a self-refresh cycle of a memory, performing a phase training update on selected individual ones of a plurality of bit lanes of a data bus for communication with a memory controller by: adjusting a bit lane transmit phase offset forward a designated number of phase steps, transmitting a training pattern, and determining a first number of errors in the transmission; adjusting the bit lane transmit phase offset backward the designated number of phase steps, transmitting the training pattern, and determining a second number of errors in the transmission; and responsive to a difference between the first number of errors and the second number of errors, adjusting a center phase position for the bit lane transmit phase offset of the selected bit lane.

FIG. 1A illustrates in block diagram form a portion of a data processing system 100 according to some implementations. In this implementation, system 100 includes generally a CPU core 105, a graphics processing unit (GPU) core 110, a set of display engines 1330, a data fabric 112, a memory controller 115, a memory controller 120, a DRAM memory 145, and a DRAM memory 150. Various other parts of the system such as peripheral controllers and system management controllers are not shown as they are not relevant to the invention.

CPU 105 is connected to data fabric 112 for fulfilling memory access requests to DRAM memory 145 and 150. CPU 105 may be implemented as a CPU core complex including multiple CPU cores with shared resources such as caches. GPU 110 may also be implemented as a core complex including multiple GPU cores. Data fabric 1350 includes a crossbar switch for routing memory access requests and memory responses between any memory accessing agent, such as CPU 105 and GPU 110, and memory controllers 115 and 120.

Memory controller 115 is connected to data fabric 112 for fulfilling memory access requests, and connected to DRAM memory 145 over data bus. Memory controller 120 is connected to data fabric 112 for fulfilling memory access requests, and connected to DRAM memory 150 over a data bus. DRAM memory 145, in this implementation is a DDR type memory such as DDR5, but other suitable DRAM memories may of course be used. DRAM memory 150 is a graphics double data rate (GDDR) type memory in this implementation. Generally memory controller 115 is dedicated to CPU 105, while memory controller 120 is dedicated to GPU 110. While a data fabric is employed in some implementations, in other implementations, memory controller 115 is in direct communication with CPU 105, and memory controller 120 is in direct communication with GPU 110. In such implementations, CPU 105 and GPU 110 are also in direct communication with each other.

Memory controller 115 includes a phase training update circuit (PTUC) 128, which performs updates to signaling parameters employed over the data bus to DRAM memory 145, as further described below with respect to FIGS. 2-7. Memory controller 120 includes a similar PTUC 128 for updating signaling parameters on the data bus to DRAM memory 150. Generally, data processing system 100 may be implemented in a personal computer, a server, gaming console, handheld device or in an embedded system such as a television or infotainment unit of a vehicle, for example. Each of these devices are subject to changes in temperature, voltage supply levels, rate of heat dissipation, rate of change of temperature and other environmental changes that may impact signaling over the data bus(ses) for communication between the processor(s) and the memory(ies). The phase training update circuits and processes disclosed herein may assist in reducing the impacts of such environmental changes.

As shown, memories 145 and 150 may, in some implementations, include a PTUC circuit similar to that of memory controllers 115 and 120, which performs phase training update processes for signaling over the data bus through bus input/output ("BUS I/O") circuitry on the memory. While, in this implementation, a separate DDRx and GDDRx memory are used, in some implementations a unified memory space is employed in which multiple processors access a single pool, or address space, of memory as managed by one or more memory controllers. A single memory controller may also be employed. Generally, the circuits and techniques herein are suitable for use in a variety of systems in which a memory controller accesses a volatile memory over a data bus such as, for example, a DDRx-compliant bus.

Figure 1B:
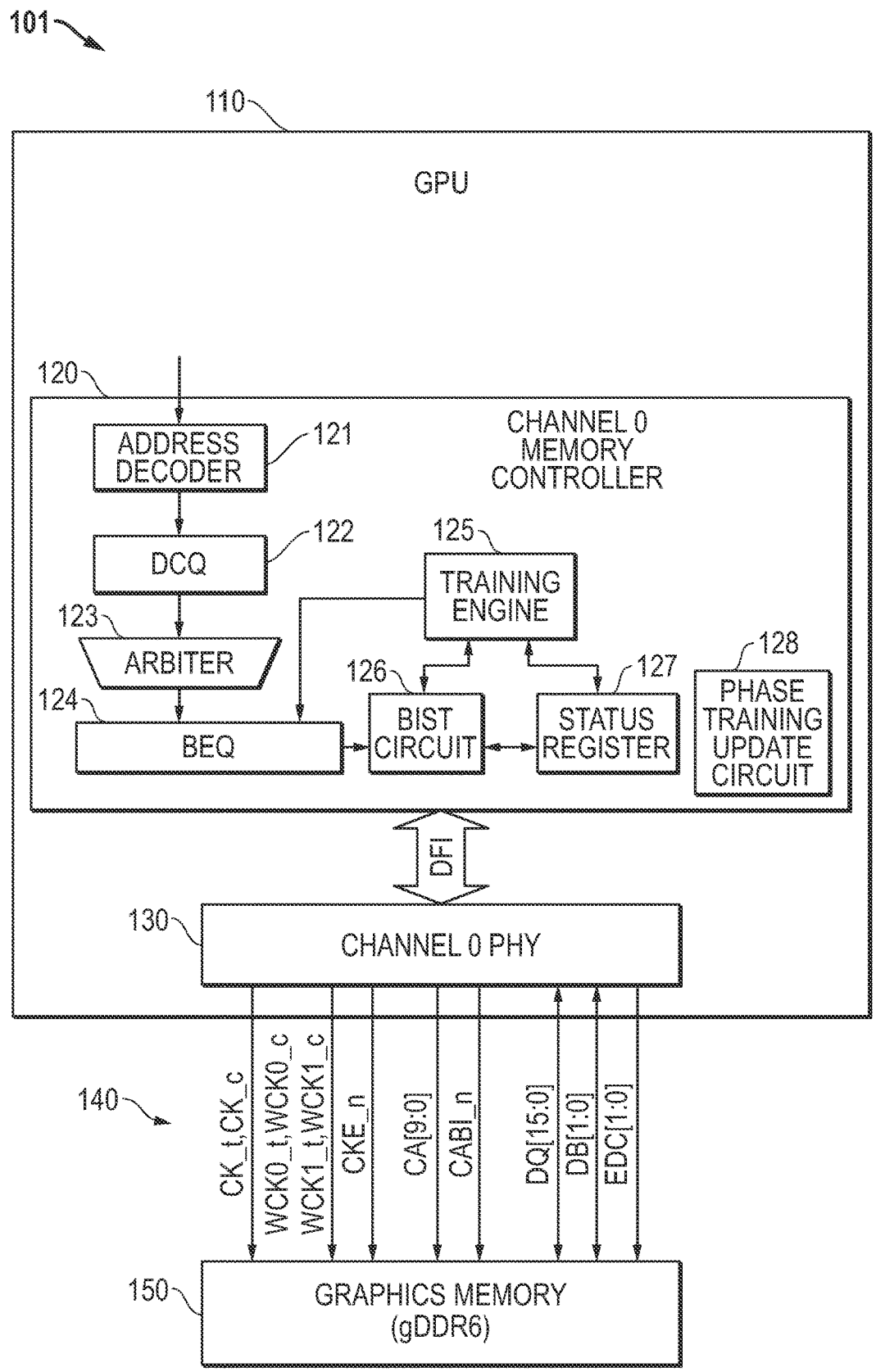
FIG. 1B illustrates in block diagram form a portion of a data processing system including a high-speed dynamic random-access memory (DRAM) according to some implementations.

FIG. 1B illustrates in block diagram form a portion of a data processing system 101 including high-speed dynamic random-access memory (DRAM) according to some implementations. Data processing system 101 includes generally a graphics processing unit 110 labelled "GPU", a memory channel 140, and a DRAM 150.

Graphics processing unit 110 includes a memory controller 120 and a physical interface circuit 130 labelled "PHY", as well as conventional components of a GPU that are not relevant to the training technique described herein and are not shown in FIG. 1. Memory controller 120 includes an address decoder 121, a command queue 122 labelled "DCQ", an arbiter 123, a back-end queue 124 labelled "BEQ", a training engine 125, a built-in self-test circuit 126 labelled "BIST", a status register 127, and a phase training update circuit 128.

Address decoder 121 has an input for receiving addresses of memory access request received from a variety of processing engines or other requesting agents in graphics processing unit 110 (not shown in FIG. 1), and an output for providing decoded addresses. Command queue 122 has an input connected to the output of command queue 122, and an output. Arbiter 123 has an input connected to command queue 122, and an output. Back-end queue 124 has a first input connected to the output of arbiter 123, a second input, a first output, and a second output not shown in FIG. 1 for providing memory commands to physical interface circuit 130. Training engine 125 has a first output connected to the second input of back-end queue 124, a first bidirectional port, and a second bidirectional port. BIST circuit 126 has an input connected to the output of back-end queue 124, a bidirectional port connected to the first bidirectional port of training engine 125, a second bidirectional port, and a third bidirectional port. Status register 127 has bidirectional port connected to the second bidirectional port of BIST circuit 126, and a second bidirectional port connected to the second bidirectional port of training engine 125. In this implementation, phase training update circuit 128 is connected to the upstream port of PHY 130. For implementations with multiple memory channels, a single phase training update circuit may be provided connected to the PHY interface of both channels, or separate phase training update circuits may be used. While in this implementation, phase training update circuit 128 is shown separately from training engine 125, in some implementations it is part of training engine 125.

PHY 130 has an upstream port bidirectionally connected to memory controller 120 over a bus labeled "DFI", and a downstream port. The DFI bus is compatible with the DDR-PHY Interface Specification that is published and updated from time-to-time by DDR-PHY Interface (DFI) Group.

Memory 150 is a memory especially suited for used with high-bandwidth graphics processors such as graphics processing unit 110, and is compatible with the Graphics Double Data Rate 6 (GDDR6) SGRAM Standard of the Joint Electron Devices Engineering Counsel (JEDEC) as standard JESD205C, published in February 2021. (As will be apparent to those of ordinary skill in the art, other memory types—such as DDRx memory—could be used in alternative implementations.) Among other things, the GDDR6 standard defines a physical interface using a 16-bit data bus, optional data bus inversion (DBI) bits, error detection code bits, and separate differential read and write clocks in order to ensure high speed transmission per-pin bandwidth of up to 16 giga-bits per second (16 GB/s). The interface signals are shown in TABLE I below:

optionally scramble or "hash" addresses in order to reduce the overhead of opening and closing pages in memory 150.

Command queue 122 stores the memory access requests including the decoded memory addresses as well as metadata such as quality of service requested, aging information, direction of the transfer (read or write), and the like.

Arbiter 123 selects memory accesses for dispatch to memory 150 according to a set of policies that ensure both high efficiency and fairness, for example, to ensure that a certain type of accesses does not hold the memory bus indefinitely. In particular, it groups accesses according to whether they can be sent to memory 150 with low overhead because they access a currently-open page, known as "page hits", and accesses that require the currently open page in the selected bank of memory 150 to be closed and another page opened, known as "page conflicts". By efficiently grouping accesses in this manner, arbiter 123 can partially hide the inefficiency caused by lengthy overhead cycles by interleaving page conflicts with page hits to other banks.

Back-end queue 124 gathers the memory accesses selected by arbiter 123 and sends them in order to memory 150 through physical interface circuit 130. It also multiplexes certain non-memory-access memory commands, such as mode register write cycles, refreshes, error recovery sequences, and training cycles with normal read and write accesses.

TABLE I

| Signal Name | Direction from PHY | Description |
| --- | --- | --- |
| CK_t, CK_c | Output | Clock: CK_t and CK_c are differential clock inputs. CK_t and CK_c do not have channel indicators as one clock is shared between both Channel A and Channel B on a device. Command Address (CA) inputs are latched on the rising and falling edge of CK. All latencies are referenced to CK. |
| WCK0_t, WCK0_c, WCK1_t, WCK1_c | Output | Write Clocks: WCK_t and WCK_c are differential clocks used for WRITE data capture and READ data output. WCK0_t/WCK0_c is associated with DQ[7:0], DBI0_n and EDC0. WCK1_t/WCK1_c is associated with DQ[15:8], DBI1_n and EDC1. The ball out has a WCK/byte but devices can be designed that support only a WCK/word. In the case of a WCK/word, for Channel A the WCK0_t and WCK0_c are active and the unused WCK1 clock is a NC; for Channel B the WCK1_t and WCK1_c are active and unused WCK0 clock is a NC. The WCK Granularity of the Vendor ID can be read to determine whether the device has been designed with a WCK/byte or a WCK/word. |
| CKE_n | Output | Clock Enable: CKE_n LOW activates and CKE_n HIGH deactivates the internal clock, device input buffers, and output drivers excluding RESET_n, TDI, TDO, TMS and TCK. Taking CKE_n HIGH provides PRECHARGE POWER-DOWN and SELF REFRESH operations (all banks idle), or ACTIVE POWER-DOWN (row ACTIVE in any bank). CKE_n must be maintained LOW throughout read and write accesses. |
| CA[9:0] | Output | Command Address (CA) Outputs: The CA outputs provide packetized DDR commands, address or other information, for example, the op-code for the MRS command. |
| DQ[15:0] | I/O | Data Input/Output: 16-bit data bus |
| DBI[1:0]_n | I/O | I/O Data Bus Inversion. DBI0_n is associated with DQ[7:0], DBI1_n is associated with DQ[15:8]. |
| EDC[1:0] | I/O | Error Detection Code. The calculated CRC data is transmitted on these signals. In addition these signals drive a 'hold' pattern when idle. EDC0 is associated with DQ[7:0], EDC1 is associated with DQ[15:8]. |
| CABI_n | Output | Command Address Bus Inversion |

In operation, memory controller 120 is a memory controller for a single channel, known as Channel 0, but GPU 110 may have other memory channel controllers not shown in FIG. 1. Memory controller 120 includes circuitry for grouping accesses and efficiently dispatching them to memory 150. Address decoder 121 receives memory access requests, and remaps the addresses relative to the address space of memory 150. Address decoder 121 may also Physical interface circuit 130 includes circuitry to provide the selected memory access commands to memory 150 using proper timing relationships and signaling. In particular in GDDR6, each data lane is trained independently to determine the appropriate delays between the read or write clock signals and the data signals. The timing circuitry, such as delay locked loops, is included in physical interface circuit 130. Control of the timing registers, however, is performed by memory controller 120.

Memory controller 120 has circuitry for providing training sequences that physical interface circuit 130 provides to memory 150 during training. After training, memory controller 120 writes trained delays to registers in physical interface circuit 130 over the DFI interface to determine interim and final delay values. In order to achieve very high data transmission rates required by the GDDR6 standard, training engine 125 determines the timing of each data lane independently from all other data lanes. Memory controller 120 uses training engine 125 to control the training sequences, result determinations, and delay values for each data lane in hardware.

Known memory controller training sequences take a very long time at startup when initial values are being determined. The initial training sequence can be on the order of several seconds. A delay this long is noticeable and negatively impacts user experience.

In order to reduce the long initial training times, as well as periodic retraining times, memory controller 120 implements a built-in self-test (BIST) technique in which a built-in self-test circuit 126 collects a data pattern on each bit lane over a series of cycles, namely the number of cycles in a read burst. In GDDR6, a read burst is 16 cycles. BIST circuit 126 forms a bit lane data group in which the bit lane over each of the 16 cycles is combined into one data unit—known as the bit lane data group—and compared in hardware to the expected data. Training engine 125 performs this evaluation independently for each data lane until a data eye-edge is found for all groups.

In order to determine the center of the data eye, training engine 125 determines the right and left eye-edges, i.e., the amount of delay at which the data signal changes from a passing condition to a failing condition, and then picks the middle point between the right and left eye-edges as the trained value for that particular data lane. Training engine 125 moves all the data phases at the same time, but then keeps track of which clock edge defines an edge of the data eye for each data lane. Further details of this technique with be explained in the remainder of this description. Memory controller 120 uses status register 127 to keep track of interim results and status of the training operation.

By performing many of the training steps in hardware rather than software, memory controller 120 reduces the amount of time required to perform both an initial training and retraining. For example, by combining data into a bit lane data group to collect data and evaluate results over a burst of 16 cycles, memory controller 120 is able to shorten training time—in some instances by a factor of about 10. Moreover, the reduction in training time can be achieved with little extra added circuitry, as will be explained more fully with reference to a specific example of built-in self-test circuit 126 below.

Phase training update circuit 128 operates for, during a self-refresh cycle of the memory, performing a phase training update on selected individual ones of the bit lanes by, as further described below. Such updates are useful in correcting the data eye drift that can occur because of temperature changes, voltage changes, and clock drift that occurs over time.

Figure 2:
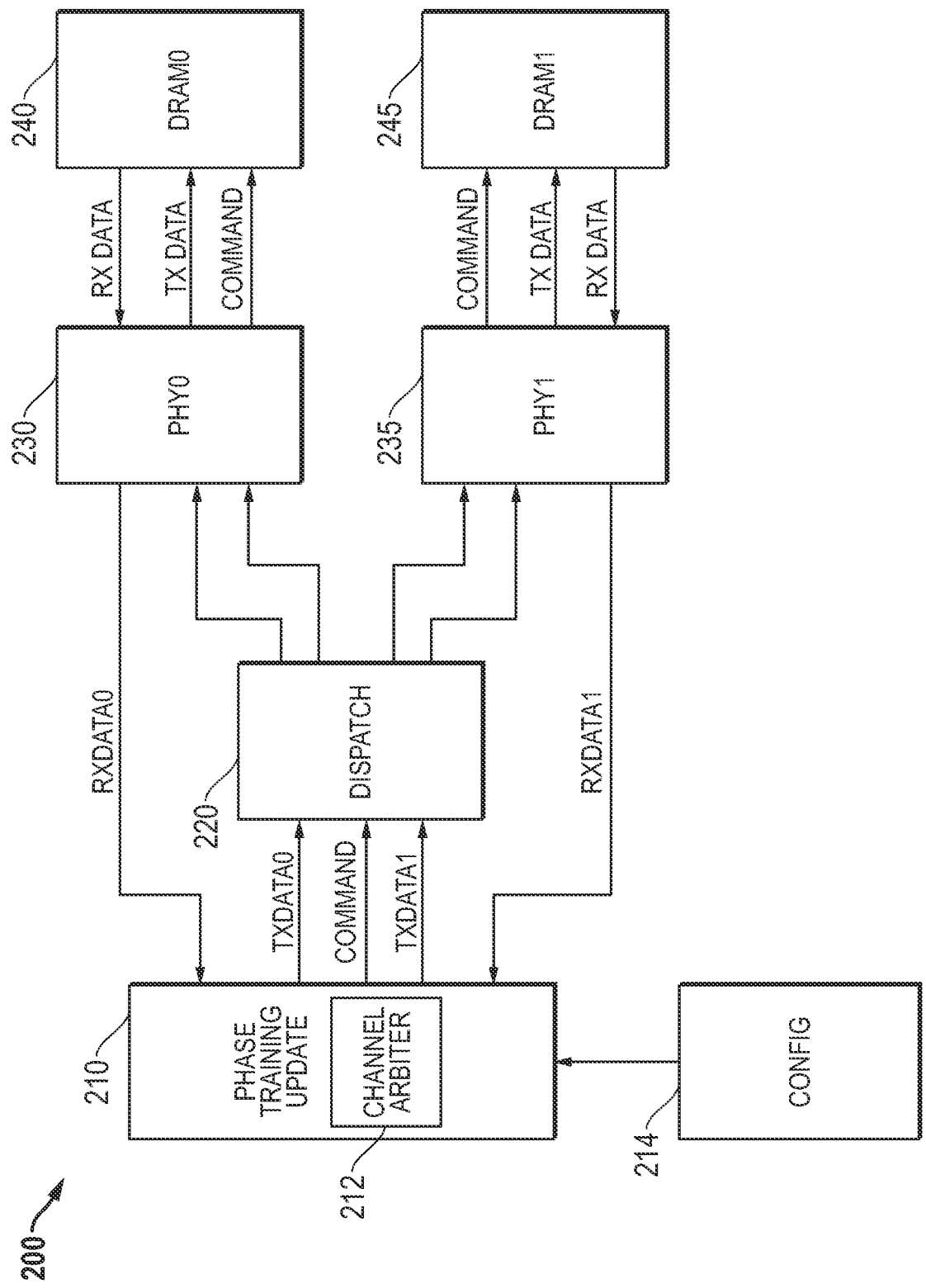
FIG. 2 illustrates in block diagram form a portion of a memory system including a phase training update circuit according to some implementations.

FIG. 2 illustrates in block diagram form a portion of a memory system 200 including a phase training update circuit 210 according to some implementations. The depicted portion of a memory system 200 includes a phase training update circuit 210, a configuration block 214, a dispatch block 220, a first PHY 230 labelled "PHY0", a second PHY 235 labelled "PHY1", a first DRAM memory 240 labelled "DRAM0", and a second DRAM memory 245 labelled "DRAM1".

Phase training update circuit 210 is suitable for use in the data processing system with two memory channels, but may of course be implemented for use with only one memory channel such as in the data processing system of FIG. 1, or for more than two memory channels. Phase training update circuit is part of a memory controller and includes a first input receiving configuration settings from configuration block 214, a second input connected to PHY 230, and a third input connected to PHY 235, and three outputs. Generally, phase training update circuit 210 includes phase training update logic and a channel arbiter 212.

Dispatch block 220 has three inputs connected to phase training update circuit 210 receiving respective transmit data and command signals labelled "TXDATA0", "COMMAND", and "TXDATA1", and first, second, third and fourth outputs. Dispatch block 220 is digital logic block which selects which PHY should fulfill particular training commands for systems including more than one memory channel and DRAM. For systems with only one DRAM channel, dispatch block 220 is not needed and phase training update circuit 210 is connected directly to the single PHY with two connections for transmit data and commands, respectively.

PHY 230 includes a variety of inputs and outputs:
first and second inputs connected to two outputs of dispatch block 220 for receiving command and transmit data, respectively;
a first output labelled "RXDATA0" for sending received data to phase training update circuit 210;
a third input labelled "RX DATA" connected to a first memory channel for receiving data from DRAM 240; and
second and third outputs labeled "TX DATA" and "COMMAND" connected to the first memory channel for sending transmit data and commands, respectively.

PHY 235 similarly includes first and second inputs connected to two outputs of dispatch block 220 for receiving command and transmit data, respectively, a first output labelled "RXDATA1" for sending received data to phase training update circuit 210, a third input labelled "RX DATA" connected to a first memory channel for receiving data from DRAM 245, and second and third outputs labeled "TX DATA" and "COMMAND" connected to the first memory channel for sending transmit data and commands, respectively.

Configuration block 214 includes configuration registers, typically loaded with values via firmware (inputs are not shown for ease of understanding), for controlling operation of the period phase training process described below. Channel arbiter 212 operates to keep track of error counts over various channels and to select a channel for performing a phase training update when time is available for such an update during a self-refresh cycle, as further described below.

Figure 3:
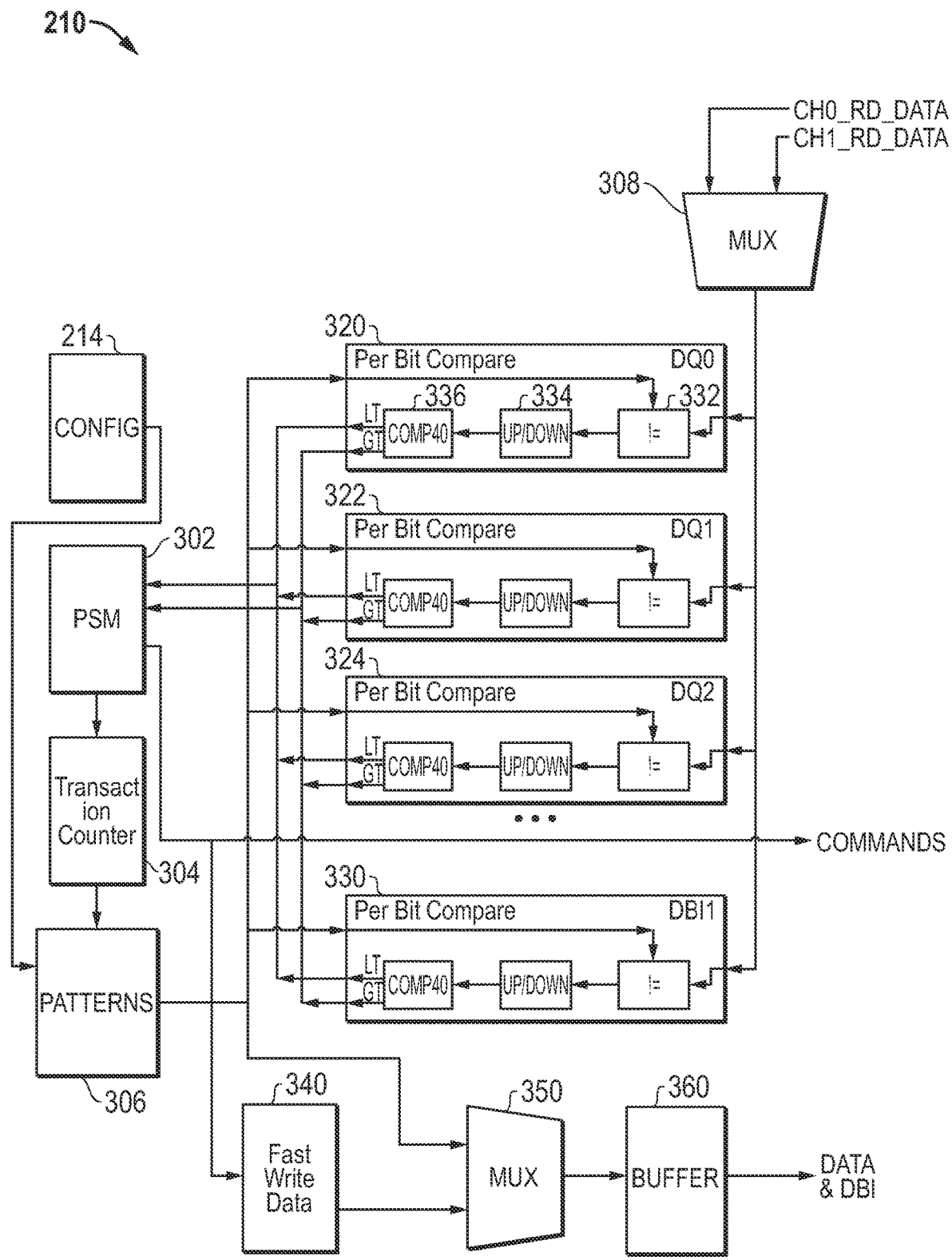
FIG. 3 illustrates in block diagram form an exemplary implementation of a phase training update circuit according to some implementations.

FIG. 3 illustrates in block diagram form an exemplary implementation of a phase training update circuit 210 according to some implementations. The channel arbiter 212 (FIG. 2), which determines which channel will receive a phase training update in a particular refresh cycle, is not shown. Phase training update circuit 210 includes configuration block 214, a finite state machine ("FSM") 302, a transaction counter 304, a pattern generator 306 labeled "PATTERNS", a multiplexer ("MUX") 308, a number of per-bit comparison circuits 320, 322, 324, and 330, labeled "Per Bit Compare", a fast write data circuit 340, a MUX 350, and a buffer 360.

Configuration block 214 has an output connected to pattern generator 306, and includes configuration registers as discussed above.

FSM 302 includes a bidirectional connection to transaction counter 304, two inputs connected to each of per-bit comparison circuits 320, 322, 324, and 330, and an output for providing commands to memory for implementing the phase update training. Generally, FSM 302 is a finite state machine including digital logic for implementing a phase update training process such as that described below respect to FIG. 6.

Transaction counter 304 has a bidirectional connection to FSM 302, and an output connected to pattern generator 306. Pattern generator 306 has an input connected to transaction counter 304, an input connected to configuration block 214, and an output connected to each of per-bit comparison circuits 320, 322, 324, and 330, and to MUX 350. MUX 308 has a first input labelled "CH0_RD_DATA", a second input labelled "CH1_RD_DATA", a control input (not shown), and an output connected to each of per-bit comparison circuits 320, 322, 324, and 330.

Fast write data circuit 340 has an input connected to FSM 302, and an output connected to MUX 350. MUX 350 has two inputs connected to pattern generator 306 and fast write data circuit 340, an output connected to buffer 360, and a control input (not shown). Buffer 360 has an input connected to the output of MUX 350, and an output labelled "DATA & DBI" for providing the data and data bus inversion signals for use in the phase training update process.

The depicted per-bit comparison circuits 320, 322, 324, and 330 are each labelled with a data lane number such as "DQ0" and "DQ1", or a data bus inversion line number such as "DBI1". In some implementations, a per-bit comparison circuit is included for at least one error detection code (EDC) pin as well. As indicated by the ellipsis, there may be more per-bit comparison circuits, one for each DQ line or data lane on the memory bus, and one for each data bus inversion line on the memory bus. Each per-bit comparison circuit includes an input for receiving the incoming data from the output of MUX 308, an input for receiving a corresponding bit of the training update data pattern from pattern generator 306, and two outputs labelled "LT" ("Less-than") and "GT" ("Greater-than") connected to FSM 302. Each per-bit comparison circuit includes a comparator 332 labelled "!=", an up/down counter 334, and a comparator 336 labelled "COMP40".

In operation, channel arbiter 212 (FIG. 2) configures MUX 308 for whichever channel is selected to have a phase training update in a particular self refresh period for the memory. FSM 302 controls the phase training update process, for example according to the process described with respect to FIG. 6. Configuration block 214 includes registers containing a training data pattern, such as the 96-bit pattern data used in this implementation, which is fed to pattern generator 306. For each cycle of burst data, this pattern generator 306 selects the correct pattern register and formats its data for transmission to the individual data lanes. Pattern generator 306 also performs the same function for checking received data, with the pattern data being divided and fed to the appropriate respective per-bit comparison circuits 320, 322, 324, and 330. During the phase training update, the data pattern for transmission is fed to MUX 350 and then to buffer 360 for transmission over the data interface of the PHY. Read, write, and control commands for performing the training are generated by FSM 302 and sent to the PHY command interface. Commands for adjusting the clock phases for the data lanes, which go to individual phase interpolators in the PHY for each data respective data lane, are formatted by fast write data circuit 340 for transmission to the PHY circuit over a fast command interface referred to as a "fast write" interface. This 256-bit fast write interface uses the same high speed data port employed for the write data sent to the PHY. The phase adjust commands are therefore multiplexed onto this port though MUX 350 and buffer 360.

When training data patterns are read back from memory to measure errors, the appropriate channel is selected by MUX 308, and the incoming data bytes (and DBI data pin values) are split into separate bits and fed to their respective per-bit comparison circuits 320, 322, 324, and 330. For example, for a memory bus with 8-bit bytes and 1 DBI pins per byte, the 9-bits are sent to respective per-bit compare circuits for each byte received over the memory channel.

At the per-bit comparison circuits, the data is compared to the training pattern data for each bit by comparators 332. Each time a bit is not equal to the pattern value, the respective up/down counter 334 is updated. When the training pattern is complete, for both sides of the data eye (as further described below with respect to FIG. 6), the value of each up/down counter 334 is compared to a predetermined threshold at comparator 336. If it is greater than the threshold, a signal is sent on the GT output of comparator 336, and if it is less than the threshold, a signal is sent on the LT output of comparator 336. FSM 302 uses these signals to control the training process as further described below with respect to FIG. 6. Transaction counter 306 includes multiple timers for tracking both internal information or the phase training update process, and for tracking information employed by channel arbiter 212 (FIG. 2) such as the time since the last phase training update for a particular channel. In some implementations, a channel becomes eligible for a phase training update selection by channel arbiter 212 on a periodic basis based on elapsed time. In other implementations, channel arbiter 212 tracks the number of self-refresh events that occur for each channel and decides which channel should receive a phase training update when a self-refresh event occurs.

Figure 4:
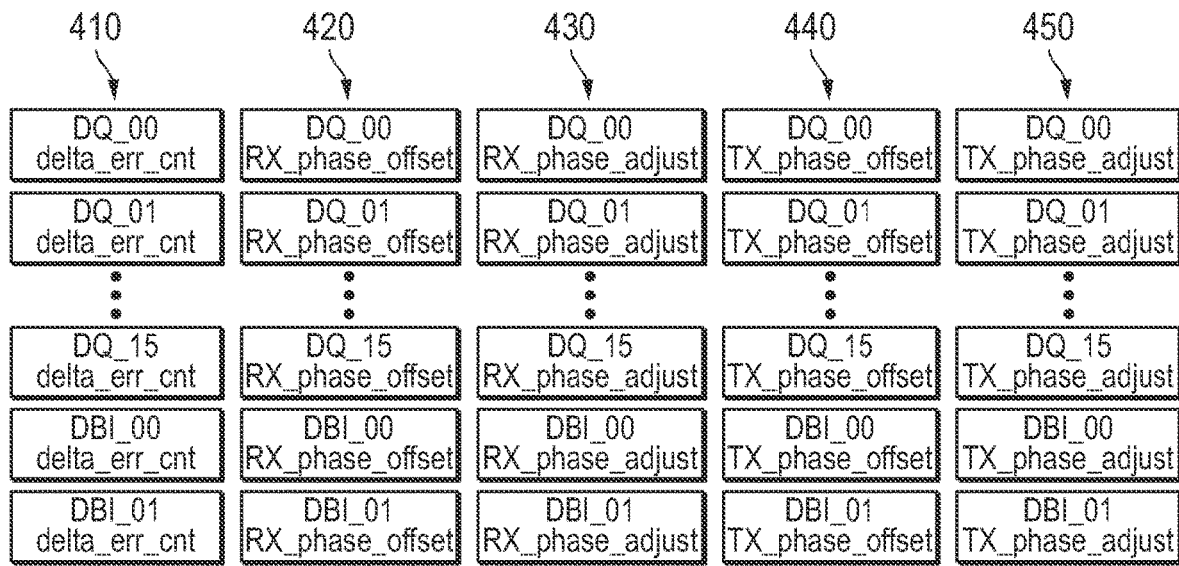
FIG. 4 shows in block diagram form a number of data structures holding variables employed by the phase training update circuit of FIG. 4 for making adjustments.

FIG. 4 shows in block diagram form a number of data structures holding variables employed by phase training update circuit 210 for making adjustments. In this example, a 16-bit byte is used, and FSM 302 employs the depicted set of variables for the phase training update process. Each bit lane has a variable error count variable 410 labelled "delta_err_cnt", a receiver phase offset variable 420 labelled "RX_phase_offset", a receiver phase adjustment variable 430 labelled "RX_phase_adjust", a transmitter phase offset variable 440 labelled "TX_phase_offset", and a transmitter phase adjustment variable 450 labelled "TX_phase_adjust". The use of these variables is further described below.

Figure 5:
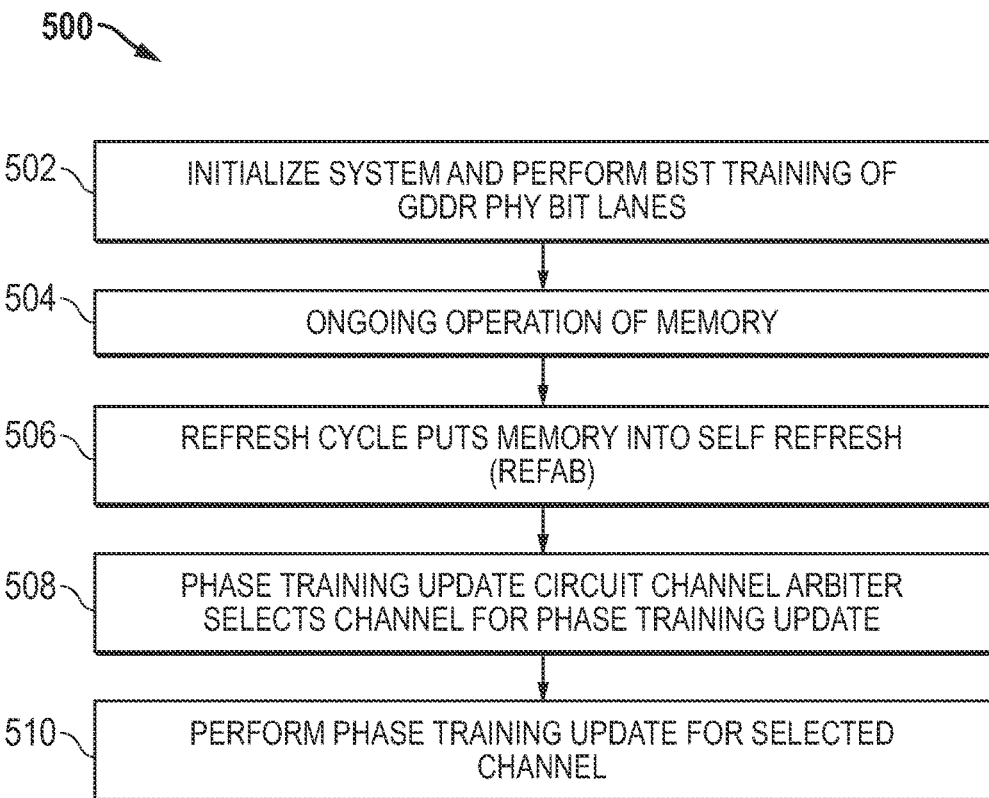
FIG. 5 shows a flow diagram of a process for operating a memory system including both built-in self-test and phase training update according to some implementations.

FIG. 5 shows a flow diagram 500 of a process for operating a memory system including both built-in self-test and phase training update according to some implementations. The process starts at block 502 where it initializes the memory system and performs BIST training of the PHY transmitters and receivers, for example on a GDDR PHY such as a GDDR6 PHY. As shown at block 504, the memory system is then put into ongoing operation with memory traffic passing through the PHY. At various points in operation, the memory is put into a self-refresh mode to maintain memory integrity and for other purposes, typically initiated by a self refresh entry (SRE) command, a refresh-all-banks command (REFab), or another command with similar functionality as shown at block 506. At these points, the memory channel is typically idle for a relatively long period, and so a phase training update may be performed. At block 508, a phase training update is initiated and, if multiple channels are present in the memory system, channel arbiter 212 selects one for an update. This selection may be based on ongoing error counts, a schedule, or other factors. Then at block 510 the phase training update is started for the selected channel and phase training update circuit performs its functions as described herein. Following the phase training update, the process returns to normal ongoing operation after the memory self-refresh cycle is completed.

Figure 6:
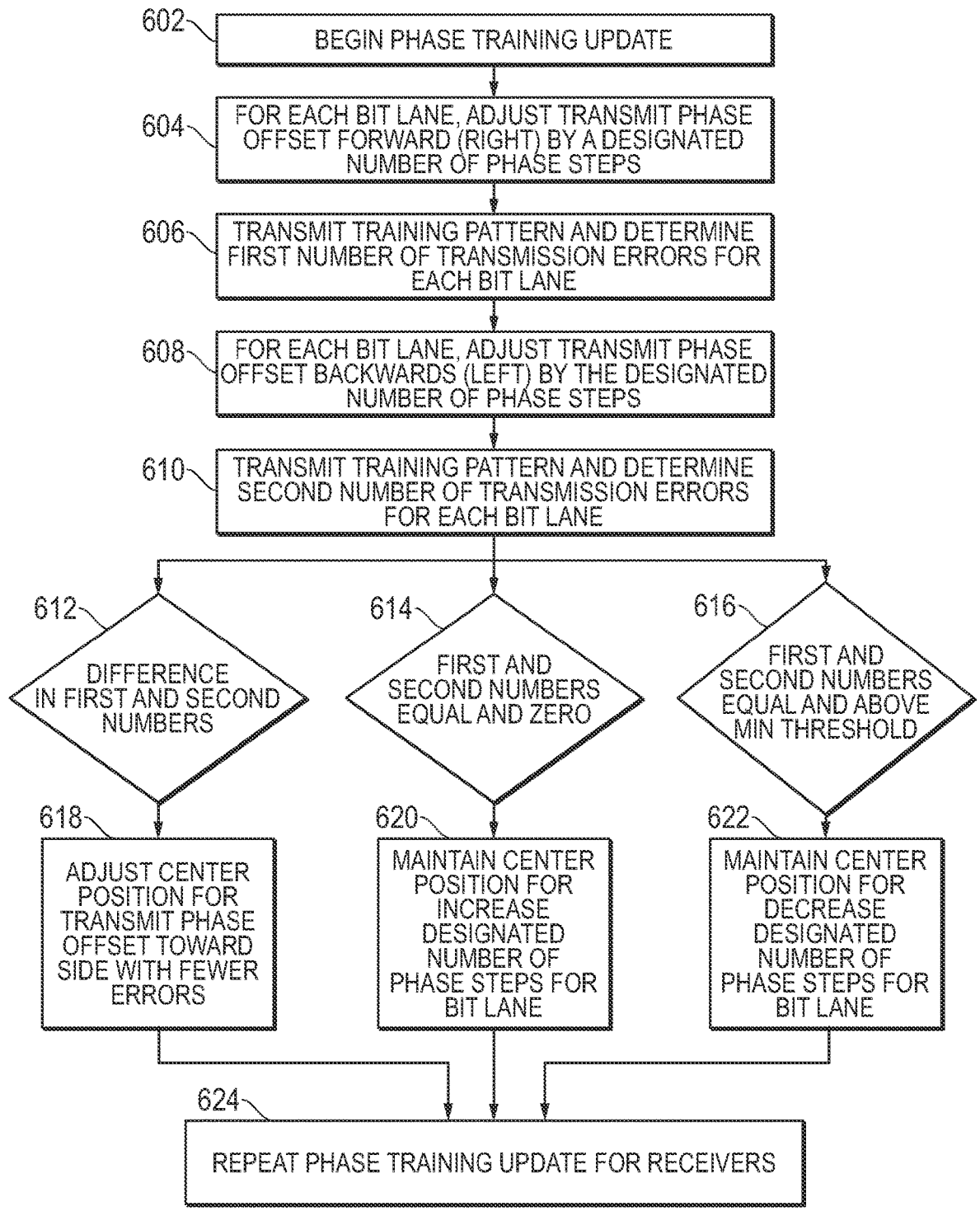
FIG. 6 shows a flow diagram of a process for performing a phase training update according to some implementations.

FIG. 6 shows a flow diagram 600 of a process for performing a phase training update according to some implementations. The depicted process is performed by a phase training update circuit such as circuit 210, and is performed during a self-refresh state of the memory on selected individual ones of the bit lanes. Preferably all bits of memory lane are updated by the depicted process. A full training cycle as described above is not able to be performed while the memory is in self-refresh state because the PHY has to be put in a different mode not available during operation, and there are time constraints that do not allow a full training to be performed.

The process begins the phase training update at block 602 on a channel identified by channel arbiter 212 (FIG. 2). Blocks 604-624 are then performed to update the phase offset of each bit lane on the channel.

At block 604, the process includes adjusting a bit lane transmit clock phase offset forward a designated number of phase steps for each bit lane. Preferably all updated lanes are adjusted together but they can be adjusted in separate steps. Then at block 606, the process includes transmitting a training pattern, and determining a first number of errors in the transmission for each bit lane. These error counts are tracked, for example, in the delta_err_cnt variables 410 (FIG. 4). The training pattern is read back from the memory with a read command to provide phase training update circuit 210 the pattern sent including any errors in transmission.

Next at block 608, the process includes adjusting the bit lane transmit phase offset backward the designated number of phase steps. Then at block 610, the process includes transmitting the training pattern, and determining a second number of errors in the transmission. The order of the backward and forward adjustments at block 604 and 608 may be reversed.

Next at block 612, responsive to a difference between the first number of errors and the second number of errors, the process goes to block 618 where it includes adjusting a center phase position for the bit lane transmit phase offset of the selected bit lane. The adjusted center phase offset is stored in TX_phase_offset 440 (FIG. 4) for the respective bit lane.

At block 614, responsive to the first number of errors and the second number of errors being the same, the process goes to block 620 where it includes maintaining a prior center phase position for the selected bit lane. In some implementations, responsive to the first number of errors and the second number of errors both being zero or below a designated threshold, the process includes maintaining a prior center phase position for the selected bit lane, as well as increasing the designated number of phase steps by which to adjust the phase (e.g., TX_phase_adjust 450 in FIG. 4) forward and backward at blocks 604 and 608, and repeating the phase training update.

At block 616, responsive to the first number of errors and the second number of errors being the same and non-zero, or above a designated minimum threshold, the process goes to block 622 where it includes maintaining a prior center phase position for the selected bit lane, decreasing the designated number of phase steps, and repeating the phase training update at block 624.

For those bit lanes on which the training cycle to be repeated, as determined at blocks 620 or 622, the process returns to block 604 and repeats the phase training update with the new size (smaller or larger) of phase step adjustment at blocks 604 and 608. In some implementations, the process is repeated once or twice from blocks 614 or 616 until a difference in numbers is found and a phase center position adjustment is made for the respective lane at blocks 612 and 618.

As shown at block 624, in some implementations the process also performs phase training updates for receivers for each bit lane. The receiver phase training update may be performed for bit lanes that include receivers on the same data line as the transmitters, or for receivers on separate bit lanes, depending on the architecture. For example, in GDDR6, the bit lanes are bi-directional and include a transmitter and receiver at each end. At the memory controller side of the phase training update process, the process for adjusting receivers is similar to that employed for transmission, but includes transmitting the data pattern to the memory and then performing the forward and backward adjustments before the data is read back from the memory.

Specifically, the process for performing phase training updates for a receiver includes adjusting a bit lane receiver clock phase offset (RX_phase_offset 420, FIG. 4) forward a designated number of phase steps, causing the memory to transmit selected data on the selected bit lane, receiving the selected data, and counting a third number of errors in the reception. Then the process adjusts the bit lane receiver phase offset backward the designated number of phase steps, causes the memory to transmit selected data on the selected bit lane, receives the selected data, and counts a fourth number of errors in the reception. Responsive to a difference between the third number of errors and the fourth number of errors, the process adjusts a center phase position for the selected bit lane receiver phase offset. Responsive to the third number of errors and the fourth number of errors being the same and zero or below a designated threshold, the process includes maintaining a prior center phase position for the selected bit lane. In some implementations, responsive to the first number of errors and the second number of errors both being zero or below a designated threshold, the process includes maintaining a prior center phase position for the selected bit lane, as well as increasing the designated number of phase steps by which to adjust the phase (e.g., RX_phase_adjust 430 in FIG. 4) forward and backward, and repeats the phase training update. Responsive to the third number of errors and the fourth number of errors being the same and non-zero, or above a designated minimum threshold, the process includes maintaining a prior center phase position for the selected bit lane, decreasing the designated number of phase steps, and repeating the phase training update.

As can be understood, the depicted process not only retrains the eye in a much shorter period of time than the original phase training during BIST, but it adjusts the width of the training as it operates. Because it operates on a per-bit basis, the process is able to make adjustments for different amounts and directions of drift that occur on individual bit lanes. This advantage is useful because frequently the different data lanes on the memory bus experience different conditions, which cause the drift to be inconsistent across the data lanes of a byte. In particular, the present inventors found that temperature, voltage, trace length, and the trace path can cause significant variations within the bits of a data byte, which prior systems have treated as being consistent. If the eye were to shrink and the phase training update process did not compensate for the shrinkage as it does in blocks 622, there would be equal errors in both directions and, consequently, the phase training update process would not be able to properly determine the eye center. Similarly, if the eye were to expand, and phase draining did not increase the width of the training as it does at block 610, it would not be able to find the correct center since no errors will be detected. The depicted process solves both these conditions. Further advantages of this solution are that it does not require much circuit area, and it is relatively quick. It can easily fit into a self-refresh cycle and therefore does not impact overall performance of the memory channel.

Figure 7:
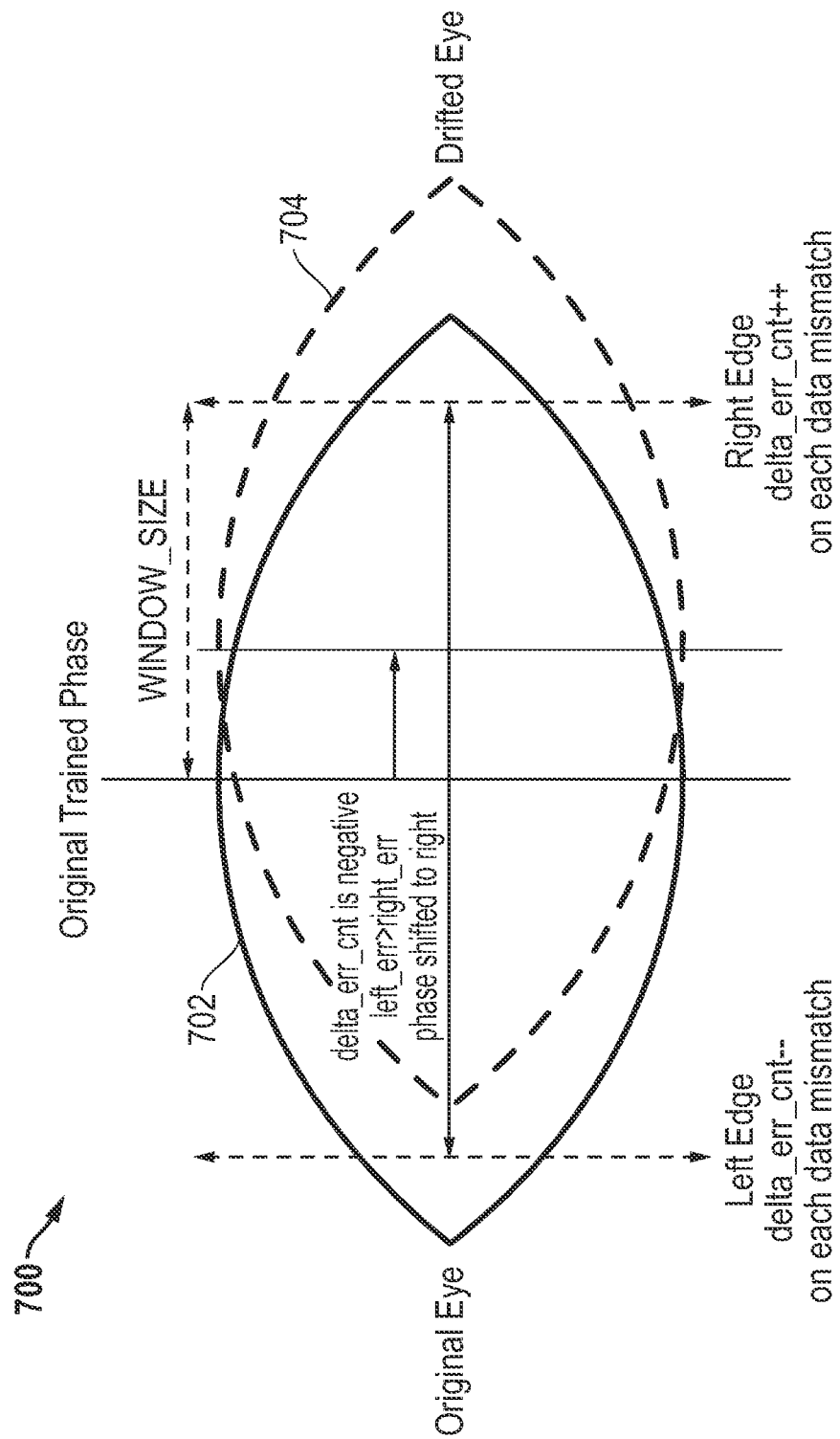
FIG. 7 shows an "eye" diagram depicting phase drift for an exemplary bit lane according to some implementations.

FIG. 7 shows an "eye" diagram depicting phase drift for an exemplary bit lane according to some implementations. Depicted are an eye plot 702 labelled "Original Eye" and an eye plot 704 labelled "Drifted Eye". Eye plot 702 shows the position of a data eye with the vertical axis showing the signal magnitude and the horizontal axis showing time relative to the center phase position of bits transmitted on a bit lane. Eye plot 702 depicts a typical data eye following the original phase training in the BIST process. The center of eye plot 702 is labelled "Original Trained Phase", the width of the eye used by the receiver in detecting bit values, or the transmitter in sending bit values, is labelled "WINDOW SIZE". The left or trailing phase edge is labelled "Left Edge", and the right or leading phase edge is labelled "Right Edge".

Eye plot 704 shows the position of the eye after variations such as temperature and voltage cause the original eye of eye plot 702 to drift over a period of operation. As shown on the drawing, in this implementation a variable "delta_err_cnt" is employed to count the errors both at blocks 606 and 610 (FIG. 6). As shown by "delta_err_cnt++", for each data mismatch detected at block 606, the count is increased. As shown by "delta_err_cnt—", for each data mismatch detected at block 610, the count is decreased. The magnitude and sign of the resulting variable following a cycle of blocks 602-610 of FIG. 6 yields a difference in the error count which is determines which adjustment is made at blocks 612, 614, or 616.

An integrated circuit containing memory controller 120, including training engine 125, built-in self-test circuit 126, and phase training update circuit 128 may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high-level design language (HDL) such as Verilog or VHDL. The description may be read by a synthesis tool which may synthesize the description to produce a netlist including a list of gates from a synthesis library. The netlist includes a set of gates that also represent the functionality of the hardware including integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular implementations have been described, various modifications to these implementations will be apparent to those skilled in the art. While the present application presented the example of a GPU accessing a GDDR6 memory because of the high memory read and write performance required, the techniques disclosed herein may be used for training for other types data processors and other types of memory. Moreover, the order of the right and left eye-edge determinations may be reversed.

Accordingly, it is intended by the appended claims to cover all modifications of the disclosed implementations that fall within the scope of the disclosed implementations.

What is claimed is:

1. A memory controller, comprising:
a phase training update circuit for performing a phase training update on selected individual ones of a plurality of bit lanes of a data bus for communication with a memory by:
adjusting a bit lane transmit phase offset forward a designated number of phase steps, transmitting a training pattern, and determining a first number of errors in the transmission;
adjusting the bit lane transmit phase offset backward the designated number of phase steps, transmitting the training pattern, and determining a second number of errors in the transmission; and
responsive to a difference between the first number of errors and the second number of errors, adjusting a center phase position for the bit lane transmit phase offset of the selected bit lane.

2. The memory controller of claim 1, wherein performing phase training updates on selected individual ones of the bit lanes further comprises performing the phase training updates during a refresh cycle of the memory.

3. The memory controller of claim 1, wherein performing phase training updates on selected individual ones of the bit lanes further comprises performing the phase training updates during an auto-refresh cycle of the memory.

4. The memory controller of claim 1, wherein performing phase training updates on selected individual ones of the bit lanes further comprises, responsive to the first number of errors and the second number of errors being the same, maintaining a prior center phase position for the selected bit lane.

5. The memory controller of claim 1, wherein performing phase training updates on selected individual ones of the bit lanes further comprises:
responsive to the first number of errors and the second number of errors being the same, maintaining a prior center phase position for the selected bit lane; and
responsive to the first number of errors and the second number of errors both being zero, maintaining a prior center phase position for the selected bit lane.

6. The memory controller of claim 1, wherein performing phase training updates on selected individual ones of the bit lanes further comprises:
responsive to the first number of errors and the second number of errors being the same and non-zero, maintaining a prior center phase position for the selected bit lane, decreasing the designated number of phase steps, and repeating the phase training update.

7. The memory controller of claim 1, wherein performing phase training updates on selected individual ones of the bit lanes further comprises:

responsive to the first number of errors and the second number of errors both being zero, maintaining a prior center phase position for the selected bit lane, increasing the designated number of phase steps, and repeating the phase training update.

8. The memory controller of claim 1, wherein the phase training update circuit further comprises:
a state machine controlling the phase training update and sending commands to a physical layer circuit (PHY) associated with the selected bit lane to adjust the respective bit lane transmit phase offsets; and
a data comparison circuit for comparing bits of the training pattern to corresponding received data bits for the selected bit lane, and counting the first number of errors and the second number of errors.

9. The memory controller of claim 8, wherein sending commands to the PHY is performed over a fast command interface for the data bus.

10. The memory controller of claim 1, wherein the phase training update circuit further operates to perform phase training updates for reception on selected individual ones of the bit lanes by:
adjusting a bit lane receiver phase offset forward a designated number of phase steps, causing the memory to transmit selected data on the selected bit lane, receiving the selected data, and counting a third number of errors in the reception;
adjusting the bit lane receiver phase offset backward the designated number of phase steps, causing the memory to transmit selected data on the selected bit lane, receiving the selected data, and counting a fourth number of errors in the reception; and
responsive to a difference between the third number of errors and the fourth number of errors, adjusting a center phase position for the selected bit lane's receiver phase offset.

11. The memory controller of claim 1, wherein the phase training update circuit further comprises an arbitration circuit for selecting a bit lane for a phase training update.

12. The memory controller of claim 1, wherein the phase training update circuit further is further configurable to, when determining the first and second number of errors in the transmission, perform one of counting the errors and receiving a count of the errors from the memory.

13. The memory controller of claim 1, further comprising a built-in self-test circuit for performing initial phase training of the plurality of bit lanes of the data bus.

14. A method for performing training of a memory channel comprising:
performing phase training updates on selected individual ones of a plurality of bit lanes of a data bus by:
adjusting a bit lane transmit phase offset forward a designated number of phase steps, transmitting a training pattern, and determining a first number of errors in the transmission;
adjusting the bit lane transmit phase offset backward the designated number of phase steps, transmitting the training pattern, and determining a second number of errors in the transmission; and
responsive to a difference between the first number of errors and the second number of errors, adjusting a center phase position for the bit lane transmit phase offset of the selected bit lane.

15. The method of claim 14, wherein performing phase training updates on selected individual ones of the bit lanes further comprises performing the phase training updates during a refresh cycle of the memory.

16. The method of claim 14, wherein performing phase training updates on selected individual ones of the bit lanes further comprises performing the phase training updates during an auto-refresh cycle of the memory.

17. The method of claim 14, wherein performing phase training updates on selected individual ones of the bit lanes further comprises, responsive to the first number of errors and the second number of errors being the same, maintaining a prior center phase position for the selected bit lane.

18. The method of claim 14, wherein performing phase training updates on selected individual ones of the bit lanes further comprises:
responsive to the first number of errors and the second number of errors being the same, maintaining a prior center phase position for the selected bit lane; and
responsive to the first number of errors and the second number of errors both being zero, maintaining a prior center phase position for the selected bit lane.

19. A data processing system, comprising:
a data processor;
a dynamic random-access memory (DRAM) coupled to the data processor over a data bus having a predetermined number of bit lanes; and
a memory controller receiving memory access requests from the data processor and dispatching memory access commands to the DRAM over the data bus, the memory controller comprising:
a phase training update circuit for performing phase training updates on selected individual ones of the bit lanes by:
adjusting a bit lane transmit phase offset forward a designated number of phase steps, transmitting a training pattern, and determining a first number of errors in the transmission;
adjusting the bit lane transmit phase offset backward the designated number of phase steps, transmitting the training pattern, and determining a second number of errors in the transmission; and
responsive to a difference between the first number of errors and the second number of errors, adjusting a center phase position for the bit lane transmit phase offset of the selected bit lane.

20. The data processing system of claim 19, wherein performing phase training updates on selected individual ones of the bit lanes further comprises performing the phase training updates during a refresh cycle of the memory.

* * * * *